United States Patent
Dewey et al.

(10) Patent No.: US 8,227,833 B2
(45) Date of Patent: Jul. 24, 2012

(54) DUAL LAYER GATE DIELECTRICS FOR NON-SILICON SEMICONDUCTOR DEVICES

(75) Inventors: Gilbert Dewey, Hillsboro, OR (US); Marko Radosavljevic, Beaverton, OR (US); Ravi Pillarisetty, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 175 days.

(21) Appl. No.: 12/646,408

(22) Filed: Dec. 23, 2009

(65) Prior Publication Data

US 2011/0147710 A1 Jun. 23, 2011

(51) Int. Cl.
*H01L 29/66* (2006.01)
(52) U.S. Cl. .......... 257/192; 257/E29.068; 257/E29.255
(58) Field of Classification Search .......... 257/192–195, 257/E29.068, E29.255
See application file for complete search history.

(56) References Cited

U.S. PATENT DOCUMENTS

2009/0194791 A1* 8/2009 Kanamura .................... 257/192

OTHER PUBLICATIONS

Hwang, et al., "Al-doped HfO2/In0.53Ga0.47As metal-oxide-semiconductor capacitors," Applied Physics Letters 98, 142901, 2011.*
Lin et al. "Ta2O3 thin films with exceptionally high dielectric constant," Applied Physics Letters 74, 16, 1999.*

* cited by examiner

*Primary Examiner* — Matthew Reames
(74) *Attorney, Agent, or Firm* — Blakely, Sokoloff, Taylor & Zafman LLP

(57) ABSTRACT

Non-silicon metal-insulator-semiconductor (MIS) devices and methods of forming the same. The non-silicon MIS device includes a gate dielectric stack which comprises at least two layers of non-native oxide or nitride material. The first material layer of the gate dielectric forms an interface with the non-silicon semiconductor surface and has a lower dielectric constant than a second material layer of the gate dielectric. In an embodiment, a dual layer including a first metal silicate layer and a second oxide layer provides both a good quality oxide-semiconductor interface and a high effective gate dielectric constant.

20 Claims, 4 Drawing Sheets

US 8,227,833 B2

DUAL LAYER GATE DIELECTRICS FOR NON-SILICON SEMICONDUCTOR DEVICES

TECHNICAL FIELD

Embodiments of the invention are in the field of Semiconductor Devices and, more particularly, transistors formed of non-silicon semiconductor materials.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity.

Recently, research on non-silicon devices like high electron mobility transistors (HEMT) employing quantum-well field effect transistors (QWFET) has increased. Quantum-well devices are typically formed in epitaxially grown semiconductor hetero-structures, such as in compound semiconductor materials like III-V systems. Such non-silicon devices offer the promise of exceptionally high carrier mobility in the transistor channels due to low effective carrier mass. Coupled with modern manufacturing techniques capable of forming nanometer scale channel lengths, transistors having ballistic carrier transport may become a reality.

However, as those in the art will appreciate, the inability to form a good quality gate dielectric (e.g., comparable to $SiO_2$ for the silicon-based devices) on compound semiconductor materials has precluded widespread adoption of III-V semiconductor transistor devices.

BRIEF DESCRIPTION OF THE DRAWINGS

The present invention is illustrated by way of example, and not by way of limitation, in the figures of the accompanying drawings, in which.

DETAILED DESCRIPTION

Figure 1:
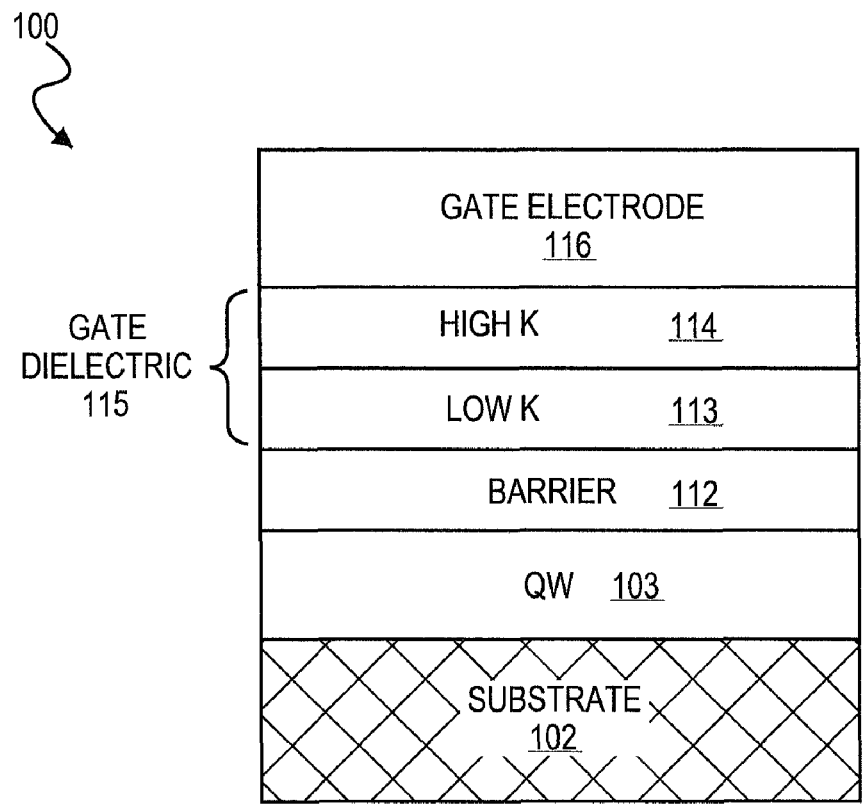
FIG. 1 illustrates a cross-sectional view of a quantum-well-based semiconductor device, in accordance with embodiments of the present invention.

Non-silicon devices employing a gate dielectric stack including at least a first and second gate dielectric are described. In the following description, numerous specific details are set forth, such as material compositions and film characteristics, in order to provide a thorough understanding of embodiments of the present invention. It will be apparent to one skilled in the art that embodiments of the present invention may be practiced without these specific details. In other instances, well-known features, such as patterning processes, are not described in detail in order to not unnecessarily obscure embodiments of the present invention. Furthermore, it is to be understood that the various embodiments shown in the Figures are illustrative representations and are not necessarily drawn to scale.

The terms "over," "under," "between," and "on" as used herein refer to a relative position of one media layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

Disclosed herein are non-silicon semiconductor devices utilizing a gate dielectric stack including at least a first and second gate dielectric to form metal-insulator-semiconductor (MIS)-type devices. While the gate dielectric stack is describe herein as disposed in a QWFET, it should be appreciated that the embodiments so described may be readily adapted to other capacitively-coupled device designs which also utilize a non-silicon surface forming an interfacing a dielectric material.

In one embodiment, a non-silicon FET device includes a III-V or germanium semiconductor substrate onto which a pair of source/drain regions is disposed. A non-native oxide is disposed over the semiconductor substrate in a channel region between the pair of source/drain regions as a first gate dielectric layer of a multi-layered gate dielectric stack. An oxide having a second dielectric constant, higher than that of the first dielectric constant, is disposed over the first gate dielectric layer in the channel region as a second gate dielectric layer. A gate electrode is further disposed over the second gate dielectric layer to control the channel region.

Also disclosed herein are methods of forming such a non-silicon FET device with a gate dielectric stack. In particular embodiments, a quantum-well-based semiconductor device is formed in III-V or germanium material system. In one embodiment, a trench is formed over the channel region of the quantum-well-based semiconductor device and the first and second gate dielectric layers are sequentially formed in the trench. A gate electrode is then formed in the trench, over the gate dielectric stack to control the channel region.

For the non-silicon channel materials which lack a good native oxide, there is a direct transition from the channel semiconductor to a non-native gate dielectric. Because of this distinction from silicon, it has been found that many of techniques developed for the formation of high-K gate dielectric materials on silicon are not successful when applied to non-silicon channels. In essence, many high-K gate dielectric materials which have met with success for silicon channel devices depend in some capacity on silicon's ability to form a good quality native oxide. Because a poor quality transition layer may be formed when such high-K dielectric materials are formed on a non-silicon channel, device channels having a non-silicon interface with the gate dielectric are not readily adaptable to current silicon-based high-K technology.

The multilayer gate dielectric embodiments described herein overcome this difficulty by first depositing a relatively low-k material on the non-silicon surface which is capable of forming a good quality interface without being constrained by a further requirement of a high gate dielectric constant. For example, amorphous oxide materials which have been found to display the good interface qualities have such low dielectric constants that the physical thickness of the resulting non-silicon device would be one or two generations behind state of the art silicon device geometries (e.g., greater than 15 Å). In embodiments herein, such relatively low-k oxide materials are utilized as a transition layer employed in conjunction with a high-k dielectric material, which itself does not otherwise provide for a good quality interface with non-silicon surfaces, to scale the non-silicon device dimensions on par with those in contemporary silicon device technologies.

Figure 2:
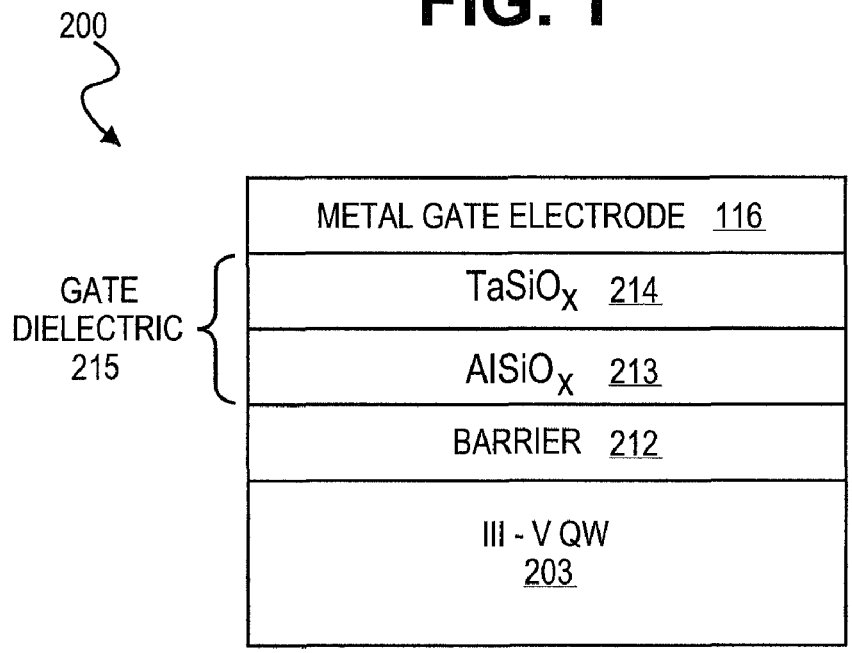
FIG. 2 illustrates a cross-sectional view of a quantum-well-based semiconductor device, in accordance with an embodiment of the present invention.

FIG. 1 depicts a stack of material layers forming a channel region, a gate dielectric and a gate electrode for a non-silicon field effect transistor (FET) portion 100. As one of skill in the art will appreciate, the stack depicted in FIG. 1 may be adapted to control a current between a pair of source drain regions (not depicted) disposed on either side of the channel region. FIG. 2 depicts a stack of material layers forming a channel region, a gate dielectric and a gate electrode for an exemplary III-V QWFET portion 200 and is to be considered a particular implementation of the more general stack depicted in FIG. 1.

Referring first to FIG. 1, a non-silicon semiconductor device is formed on a substrate 102 composed of a material suitable for semiconductor device fabrication. In one embodiment, substrate 102 is a bulk substrate composed of a single crystal of a material which may include, but is not limited to, silicon, germanium, silicon-germanium or a III-V compound semiconductor material. In another embodiment, substrate 102 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 102 includes a top epitaxial layer on a middle insulator layer which is above a lower bulk layer. The top epitaxial layer is composed of a single crystal layer which may include, but is not limited to, silicon (e.g., to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 102 may further include dopant impurity atoms.

Disposed over the substrate 102 is a quantum-well channel region 103 which is composed of one or more material layers suitable to propagate a wave-function with low resistance. In accordance with an embodiment of the present invention, the quantum-well channel region 103 has a lattice constant suitably matched to the substrate 102 (e.g., the lattice constants are similar enough that dislocation formation in the quantum-well channel region 103 does not render the device inoperable). In alternative embodiments, the quantum-well channel region 103 has a lattice constant suitably matched to that of a bottom barrier layer of a hetero-structure (not shown) disposed between the quantum-well channel region 103 and the substrate 102. In certain embodiments, the quantum-well channel region 103 is composed of germanium or a II-VI semiconductor material. In other embodiments, the quantum-well channel region 103 is composed of groups III (e.g. boron, aluminum, gallium or indium) and V (e.g. nitrogen, phosphorous, arsenic or antimony) elements. In the exemplary QWFET channel stack 200 depicted in FIG. 2, a III-V quantum-well channel region 203 is composed of InAs, InSb, InGaAs, or GaAs. Depending on the materials utilized, the quantum-well channel region has a physical thickness approximately in the range of 50-200 nanometers.

A stack of one or more crystalline semiconductor layers, such as a compositional buffer layer with a bottom barrier layer disposed thereon may be required between the quantum-well channel region and the substrate. The compositional buffer layer may be composed of a crystalline material suitable to provide a specific lattice structure onto which a bottom barrier layer may be formed with negligible dislocations. For example referring to FIG. 1, the compositional buffer layer may be used to change, by a gradient of lattice constants, the exposed growth surface from the lattice structure of substrate 102 to one that is more compatible for epitaxial growth of high quality, low defect density layers thereon. In an embodiment where the substrate 102 is composed of single-crystal silicon, a compositional buffer layer is composed of a layer of InAlAs having a physical thickness of approximately 1 micron. A bottom barrier layer (not shown) may be composed of a material suitable to confine a wave-function in the quantum-well channel region 103 formed thereon. In one embodiment, a bottom barrier layer of approximately $In_{0.65}Al_{0.35}As$ having a physical thickness of approximately 10 nanometers (nm) is used for quantum confinement in an N-type semiconductor device. In another embodiment, the bottom barrier layer of approximately $In_{0.65}Al_{0.35}Sb$ having a thickness of approximately 10 nanometers is used for quantum confinement in a P-type semiconductor device.

A top barrier layer may be composed of a material suitable to confine a wave-function in the underlying quantum-well channel region. In accordance with an embodiment of the present invention, the barrier layer 112 (FIG. 1) has a lattice constant suitably matched to the lattice constant of the quantum-well channel region 103 (e.g., the lattice constants are similar enough that dislocation formation in barrier layer 112 is negligible). The barrier layer 112 may be a material such as, but not limited to gallium nitride (GaN), indium phosphide (InP), or indium gallium phosphide (InGaP) for III-V substrates or silicon germanium (SiGe) for germanium substrates. For the exemplary III-V embodiment depicted in FIG. 2, the barrier layer 212 is InP.

Disposed over the quantum well channel region is a gate dielectric stack including a plurality of gate dielectric material layers. In the embodiment depicted in FIG. 1, the gate dielectric stack 115 includes first gate dielectric layer 113 having a first dielectric constant disposed over the quantum well channel region 103 and a second gate dielectric layer 114, having a second dielectric constant disposed over the first gate dielectric layer 113. As depicted in FIG. 1, the first gate dielectric layer 113 has a lower dielectric constant than the second gate dielectric layer 114. In the exemplary embodiment, the second gate dielectric layer 114 is disposed on, in contact with, the first gate dielectric layer 113. For embodiments including the barrier layer 112, the first gate dielectric layer 113 is disposed on, in contact with, the barrier layer 112. Alternatively, where the barrier layer 112 is absent, the first gate dielectric layer 113 is disposed directly on the quantum-well channel region 103.

In embodiments, the first gate dielectric layer 113 is a non-native oxide or nitride which is selected to provide a good interface with the underlying non-silicon semiconductor (e.g., III-V, germanium, etc.). In certain embodiments, the first gate dielectric layer 113 is metal oxide or metal nitride. In one metal oxide embodiment, a III-IV metal oxide is employed. Group III metals include any of aluminum, gallium or indium. The group IV element is either silicon to form a silicate or germanium to form a germanate. In another metal oxide embodiment, the first gate dielectric layer 113 is a metal silicate having an oxygen-ligand. For the metal silicate embodiments, the metal may be a group III element (aluminum, gallium or indium) or any of tantalum, hafnium, zirconium, or titanium. In the exemplary III-V QWFET embodiment as depicted in FIG. 2, the first gate dielectric layer 113 is an aluminum silicate 213. In alternative embodiments where the first gate dielectric layer 113 is a non-native nitride, insulating metal nitrides and semiconductor nitrides having a dielectric constant between about 5 and 12 may be employed.

For the exemplary metal silicate embodiment, the silicon content of the metal silicate in the first gate dielectric may be varied to achieve a high quality interface with the underlying non-silicon semiconductor and to arrive at a desired effective dielectric constant for the gate dielectric stack. As such, the metal silicate may either be a stoichiometric film or sub-stoichiometric film with respect to either silicon or oxygen. For example, in one aluminum silicate embodiment, an amount of silicon may be added to achieve a stoichiometric aluminum orthosilicate ($Al_4(SiO_4)_3$) film. In an alternative embodiment employing an aluminum silicate with a sub-stoichiometric amount of silicon, the ratio of silicon:aluminum is less than that of the stoichiometric film. Similarly, a stoichiometric tantalum silicate ($Ta_4(SiO_4)_5$) or a sub-stoichiometric tantalum silicate, having a smaller silicon:tantalum ratio than the stoichiometric film, may be employed.

Modification of the silicon content in the first gate dielectric layer (e.g., to be a non-stoichiometric film) varies the dielectric constant of the first gate dielectric layer. Generally, increasing the amount of silicon in the first gate dielectric layer will initially increase the coordination bonding of the metal ion in preference to the formation of silica, such that the dielectric constant of the film will initially increase as the film layer approaches a stoichiometric silicate ratio. At an upper limit of silicon content, the dielectric constant of the film decreases as silica formation increases with further silicon addition. Therefore, in addition to selecting a more or less electronegative metal, a wide range of dielectric constants may be achieved by varying the silicon content of a film containing a particular metallic constituent. It has been found that metal silicates, in particular aluminum silicate, having an amount of silicon which provides for a relatively low dielectric constant (e.g., below about 10) improves the quality of the interface (e.g., lower interface defects (Dit) and frequency dispersion) relative to metal oxides and metal silicates having a higher dielectric constant (e.g., over 18). In the exemplary III-V embodiment depicted in FIG. 2, the first gate dielectric layer 213 comprises aluminum silicate with a silicon content such that the first gate dielectric layer has a dielectric constant of approximately 7. As such, even for a III-V material lacking a good quality native oxide (e.g., III-V and germanium materials), the first gate dielectric layer may still form a good quality interface with the underlying non-silicon semiconductor.

The metal silicate layer may be as thin as a single interfacial layer, but in one embodiment the metal silicate layer is a bulk film having a greater physical thickness than merely an interfacial layer. As used herein, a "bulk film" is one which is at least two monolayers thick. A greater physical film thickness has greater latitude in tuning the silicon content of the first dielectric layer to achieve a good quality interface with the underlying non-silicon layer. The physical thickness of the first dielectric layer may vary based on the dielectric constant of the materials chosen for the first and second dielectric layers and the effective dielectric constant desired for the gate dielectric stack. For example, in one embodiment where a first dielectric layer has a dielectric constant of about 5, the first dielectric layer has a physical thickness less than about 6 Å. In an embodiment where the first dielectric layer has a dielectric constant of about 9, the first dielectric layer has a physical thickness of less than about 10 Å. In the exemplary embodiment depicted in FIG. 2, the first gate dielectric layer 213 has a physical thickness of between 3 Å and 10 Å.

Referring back to FIG. 1, the second gate dielectric layer 114 has a higher dielectric constant than the first gate dielectric layer 113 to achieve a suitably high effective dielectric constant for the dielectric stack 115 such that the non-silicon-based devices described herein may have physical dimensions on par with silicon-based devices while still possessing good electrical device characteristics (e.g., sufficiently low gate leakage). As an example, absent the second gate dielectric layer 114, an aluminum silicate utilized for the first gate dielectric layer for a good quality interface would need an electrical thickness of greater than 15 Å to achieve sufficiently low gate leakage. Such a thickness would place the non-silicon device one or two generations behind contemporary silicon device dimensions. The effective non-silicon device gate dielectric thickness may be reduced through introduction of the second gate dielectric layer 114. Because the second gate dielectric layer 114 is displaced from the non-silicon channel surface by the first gate dielectric layer 113, the higher dielectric constant of the second gate dielectric layer 114 is less deleterious to device performance (e.g., phonon scattering is lower and Dit is lower) than if such a high dielectric constant film was disposed directly on the non-silicon semiconductor interface (in the absence of a good quality native oxide).

In an embodiment, the second gate dielectric layer 114 comprises material having a dielectric constant between 18 and 24. In one such embodiment, the second gate dielectric layer 114 is a metal oxide, such as, but not limited to, hafnia ($HfO_2$), zirconium dioxide ($ZrO_2$), tantalum pentoxide ($Ta_2O_5$), and aluminum oxide ($Al_2O_3$). In a particular embodiment, the second gate dielectric layer 114 is a silicate. Both the metal and the silicon content may be selected to achieve the desired higher dielectric constant without regarding III-V semiconductor interface quality. In one such embodiment, the second gate dielectric layer 114 comprises a silicate of different metal than in the first gate dielectric layer 113. Similar to the first gate dielectric layer, a stoichiometric or sub-stoichiometric silicate may be utilized in the second gate dielectric layer 114. As an example, in the III-V embodiment depicted in FIG. 2, the second gate dielectric layer 214 is tantalum silicate selected to have a silicon content such that the second gate dielectric layer 214 has a dielectric constant of approximately 20.

Disposed over the gate dielectric stack (115 in FIG. 1 or 215 in FIG. 2) is a gate electrode 116. In one embodiment, the gate electrode 116 is a metal gate electrode. Any metal known in the art may be selected to achieve the desired work function based on the particular materials in the quantum well channel region 103. In embodiments, the gate electrode 116 is composed of a material such as, but not limited to, a metal nitride, a metal carbide, a metal silicide, hafnium, zirconium, titanium, tantalum, aluminum, ruthenium, palladium, platinum, cobalt or nickel. A stack including a workfunction metal and a conductive metal cap or a stack of a workfunction metal and a conductive polycrystalline silicon, germanium, silicide, or germanicide may also be utilized for the gate electrode 116.

In another aspect of the present invention, a method of forming a quantum-well-based HEMT device includes a gate-last or replacement gate method to fabricate group III-V or germanium quantum-well field effect transistor (QWFET) devices. This approach may enable one or more of the following features: (1) all materials including source and drain material are grown first and then a trench is etched in the source and drain material to accommodate a gate electrode, (2) a high band gap barrier material and the multi-layered gate dielectric stacks described herein may be deposited by atomic layer deposition (ALD) or metal-organic chemical vapor deposition (MO-CVD) later in the process flow, and (3) a gate-last flow may enable the lowest thermal budget to be applied to the gate electrode and dielectric materials.

Figure 3:
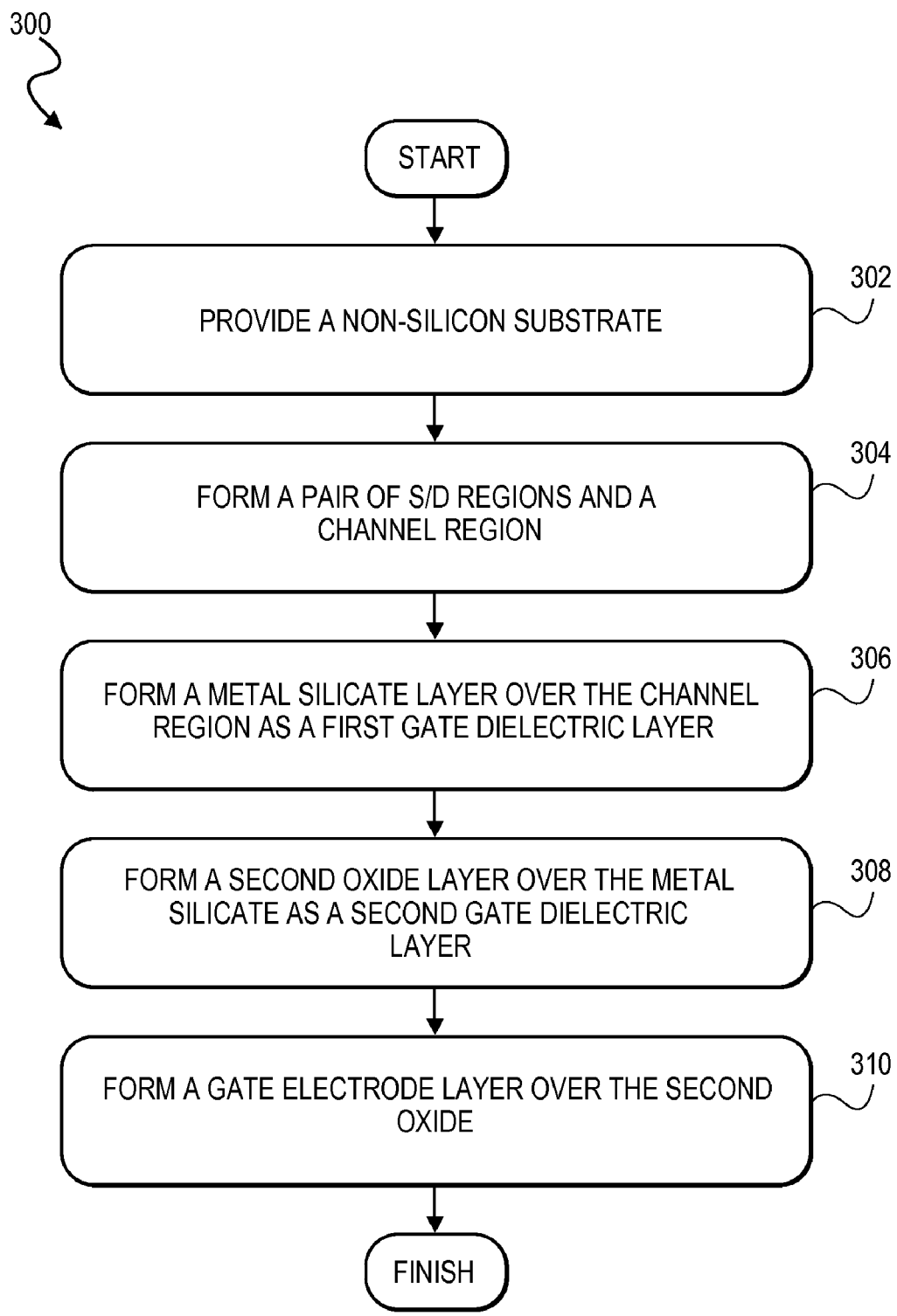
FIG. 3 is a Flowchart representing operations in the fabrication of a quantum-well-based non-silicon device, in accordance with an embodiment of the present invention.

FIG. 3 depicts a fabrication method 300 highlighting particular operations in the fabrication of a quantum-well-based semiconductor device, in accordance with an embodiment of the present invention. FIGS. 4A-4F illustrate cross-sectional views of a quantum-well-based semiconductor device following performance of the particular fabrication operations illustrated in FIG. 3, in accordance with an embodiment of the present invention.

Figure 4A:
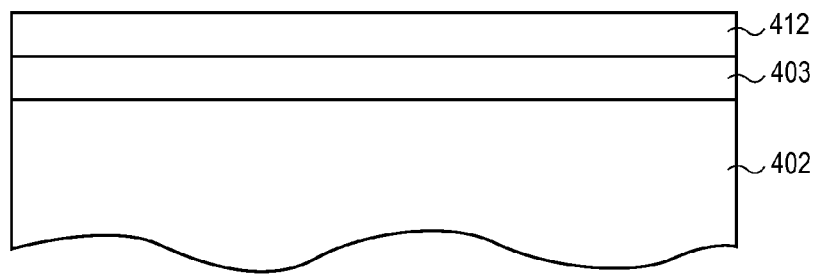
FIG. 4A illustrates a cross-sectional view representing formation of a quantum-well-on a substrate, in accordance with an embodiment of the present invention.

Referring to operation 302 and corresponding FIG. 4A, a quantum-well-based semiconductor device begins with provision of a barrier layer 412 disposed on a quantum well structure 403 disposed above a substrate 402. The substrate 402 may be any of those described in the context of FIG. 1. Likewise, the barrier layer 412 and the quantum well structure 403 may be any of those described for the barrier layers 112, 212 and quantum well channel regions 103, 203, respectively.

Figure 4B:
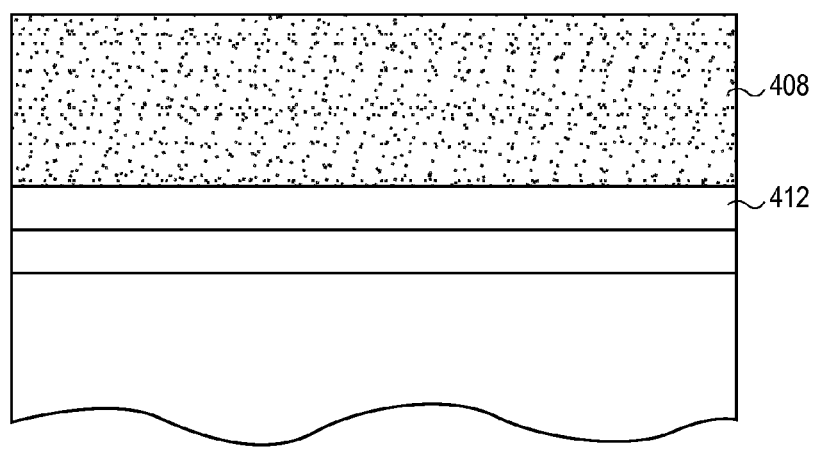
FIG. 4B illustrates a cross-sectional view representing formation of a pair of source/drain regions of a non-silicon device, in accordance with an embodiment of the present invention.
Figure 4C:
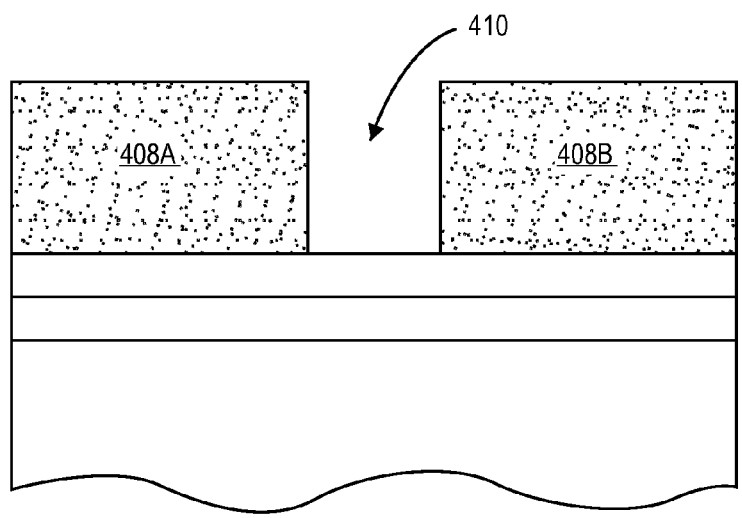
FIG. 4C illustrates a cross-sectional view representing formation of a trench over a channel region of the non-silicon device, in accordance with an embodiment of the present invention.

Returning to FIG. 3, a pair of source and drain regions (i.e., "source/drain") are formed at operation 304. As illustrated in FIG. 4B a source/drain material layer 408 is first formed above barrier layer 412. In accordance with an embodiment of the present invention, where the quantum well structure 403 includes a group III-V material, the source/drain material layer 408 is a doped group III-V semiconductor material. In one embodiment, forming the source/drain material layer 408 includes molecular-beam epitaxial deposition. As further illustrated in FIG. 4C, a trench 410 is then formed in the source/drain material layer 408 to provide a source region 408A separated from a drain region 408B (i.e., pair of spaced-apart source/drain regions). In accordance with one embodiment, the trench 410 is formed by a dry or wet etch process and the top surface of the barrier layer 412 acts as an etch stop, as depicted in FIG. 4C. In accordance with an alternative embodiment of the present invention, trench 410 is formed by a dry or wet etch process and the top surface of the quantum well structure 403 provides an etch stop.

Figure 4D:
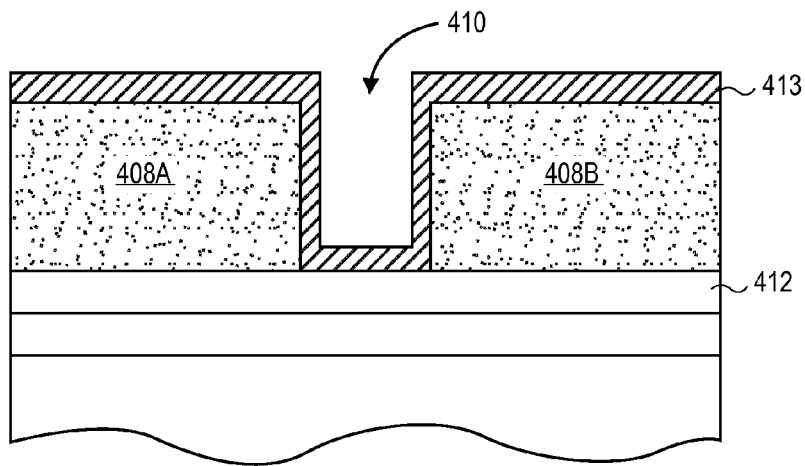
FIG. 4D illustrates a cross-sectional view representing formation of a first gate dielectric layer of the non-silicon device, in accordance with an embodiment of the present invention.

Returning to FIG. 3, at operation 306, and as further illustrated in FIG. 4D, a first gate dielectric layer 413 is deposited into the trench 410 to be in contact with the barrier layer 412. The first gate dielectric layer 413 may be formed with either of atomic layer deposition (ALD) or metal-organic chemical vapor deposition (MO-CVD) to achieve any of the material compositions described elsewhere herein for the first gate dielectric layers 113, 213 using known precursors and processing equipment conventional in the art. In an embodiment, prior to forming the first gate dielectric layer 413, the source/drain material layer 408 is heated to a temperature approximately at, or above, 550 degrees Celsius.

Figure 4E:
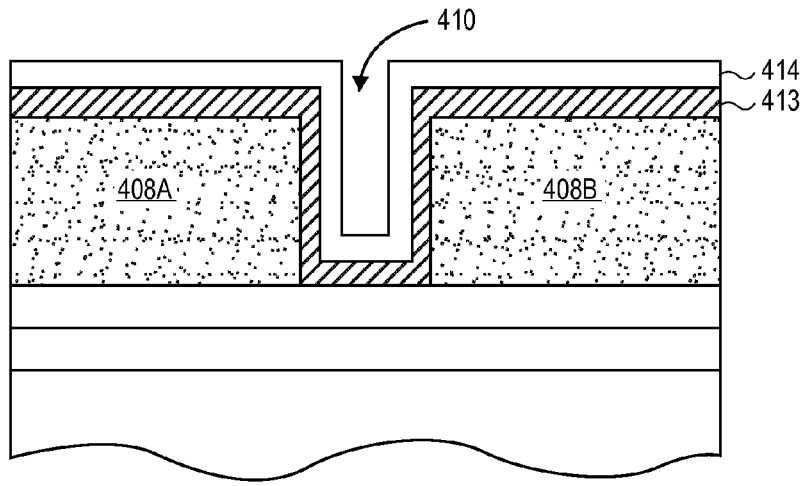
FIG. 4E illustrates a cross-sectional view representing formation of a second gate dielectric layer of the non-silicon device, in accordance with an embodiment of the present invention.

At operation 308 in FIG. 3 and as further illustrated in corresponding FIG. 4E, a second gate dielectric layer 414 is then deposited in the trench 410, between the source and drain regions 408A and 408B to be in contact with the first gate dielectric layer 413. The second gate dielectric layer 414 may be formed with either of atomic layer deposition (ALD) or metal-organic chemical vapor deposition (MO-CVD) to achieve any of the material compositions described elsewhere herein for the second gate dielectric layers 114, 214 using known precursors and processing equipment conventional in the art.

Figure 4F:
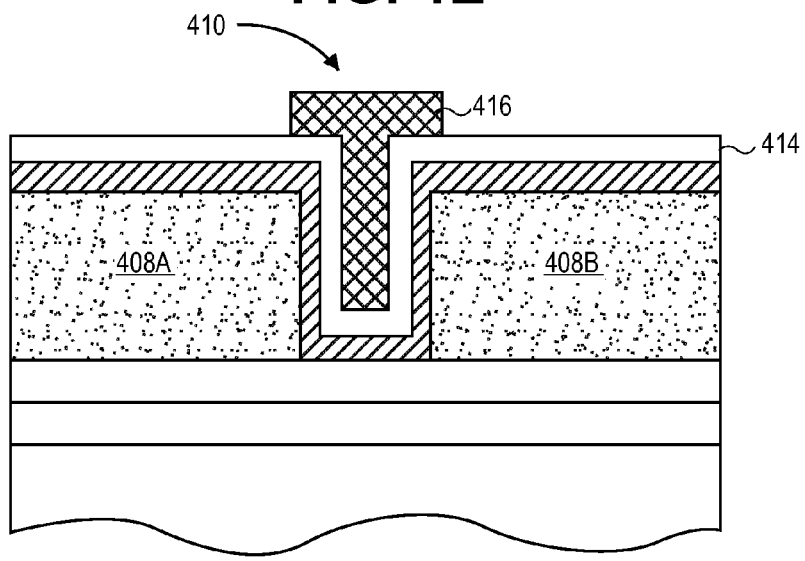
FIG. 4F illustrates a cross-sectional view representing formation of a gate electrode, in accordance with an embodiment of the present invention.

With the dual layer gate oxide dielectric formed, at operation 310 (FIG. 3) a gate electrode is formed. As depicted in FIG. 4F, a gate electrode material is deposited in the trench 410, on the second gate dielectric layer 414. Any of the materials described for the gate electrode layer 116 may be utilized. In accordance with an embodiment of the present invention, the gate electrode material is a metal deposited and then patterned by lithography or polishing schemes known in the art to form the gate electrode 416.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A non-silicon field effect transistor, comprising:
   a III-V or germanium semiconductor substrate;
   a pair of source/drain regions in the semiconductor substrate with a channel region disposed there between;
   a first gate dielectric layer disposed over the semiconductor substrate, the first gate dielectric layer comprising a metal silicate and having a first dielectric constant below 10;
   a second gate dielectric layer disposed over the first gate dielectric layer, the second gate dielectric layer comprising an oxide having a second dielectric constant, higher than the first dielectric constant; and
   a gate electrode disposed over the second gate dielectric layer to control the channel region.

2. The non-silicon transistor as in claim 1, wherein the first gate dielectric layer is a metal silicate bulk film having a thickness greater than a single interfacial layer.

3. The non-silicon transistor as in claim 1, wherein the second gate dielectric layer comprises a metal oxide and the second gate dielectric constant is between 18 and 24.

4. The non-silicon transistor as in claim 1, wherein the first gate dielectric layer is selected from the group consisting of: aluminum silicate, tantalum silicate, hafnium silicate, zirconium silicate and titanium silicate.

5. The non-silicon transistor as in claim 1, wherein the first gate dielectric layer comprises aluminum silicate and wherein the first dielectric constant is approximately 7.

6. The non-silicon transistor as in claim 1, wherein the first gate dielectric layer comprises a sub-stoichiometric amount of silicon.

7. The non-silicon transistor as in claim 3, wherein the metal oxide is an oxide of a metal selected from the group consisting of Zr, Hf, Ta, and aluminum.

8. The non-silicon transistor as in claim 1, wherein the metal oxide is a metal silicate.

9. The non-silicon transistor as in claim 8, wherein the second gate dielectric layer comprises tantalum silicate with sub-stoichiometric ratio of silicon, and wherein the second dielectric constant is approximately 20.

10. The non-silicon transistor as in claim 1, further comprising:
    a barrier layer on the semiconductor substrate below the first gate dielectric layer, wherein the barrier layer comprises a compound semiconductor selected from the group consisting of: InP, GaN, InGaP if the semiconductor substrate is a III-V compound or comprises SiGe if the semiconductor substrate is germanium.

11. The non-silicon transistor as in claim 9, wherein the III-V or germanium semiconductor substrate further comprises a hetero-structure including a quantum-well in the channel region, and wherein the device further comprises:
    a trench in a material layer overlying the barrier layer to expose the barrier layer; and
    the first and second gate dielectric layers disposed in the trench, between the pair of source/drain regions; and
    the gate electrode disposed in the trench.

12. A quantum well field effect transistor (QWFET), comprising:
    a hetero-structure disposed above a substrate and comprising a quantum-well in a channel region between a pair of source/drain regions;
    a barrier layer disposed over the quantum-well in the channel region;
    a trench disposed in a material overlying the quantum-well;
    a first gate dielectric layer disposed in the trench and directly on the barrier layer, the first gate dielectric layer having a first dielectric constant and comprising a III-IV oxide;
    a second gate dielectric layer disposed in the trench and directly on the first gate dielectric layer, the second gate dielectric layer comprising an oxide having a second dielectric constant, higher than the first dielectric constant; and
    a gate electrode disposed in the trench and directly on the second gate dielectric layer, above the first gate dielectric layer.

13. The QWFET as in claim 12, wherein the group III element is aluminum, indium, or gallium and wherein the group IV element is silicon to form a silicate first gate dielectric layer or germanium to form a germanate first gate dielectric layer, and wherein the second gate dielectric layer comprises a metal oxide.

14. The QWFET as in claim 12, wherein the first gate dielectric layer comprises aluminum silicate and the first dielectric constant is between 6 and 10, and wherein the second gate dielectric layer comprises tantalum silicate and the second dielectric constant is between 18 and 24.

15. A method of forming a semiconductor device on a non-silicon substrate, the method comprising:
    receiving a III-V or germanium semiconductor substrate;
    forming a pair of source/drain regions in the semiconductor substrate and a channel region there between;
    forming a first gate dielectric layer over the channel region, the first gate dielectric layer comprising a metal silicate and having a first dielectric constant below 10;
    forming a second gate dielectric layer over the first gate dielectric layer, the second gate dielectric layer having a second dielectric constant, higher than the first; and
    forming a gate electrode over the second gate dielectric layer to control the channel region.

16. The method as in claim 15, wherein the first gate dielectric is a metal silicate including a group III metal and the first dielectric constant is between 6 and 10, and wherein the second gate dielectric layer comprises a metal oxide and the second dielectric constant is between 18 and 24.

17. The method as in claim 16, wherein forming the first gate dielectric layer further comprises depositing aluminum silicate to a thickness of between 3Å and 10Å.

18. The method as in claim 16, wherein the metal oxide is selected from the group consisting of zirconium oxide, hafnium oxide, alumina, and tantalum silicate.

19. The method of claim 18, wherein forming the second gate dielectric layer further comprises depositing tantalum silicate to a thickness of between 10 Å and 20Å.

20. The method of claim 15, further comprising:
    forming a barrier layer on the semiconductor substrate prior to forming the first gate dielectric layer, wherein the barrier layer comprises SiGe if the semiconductor substrate is germanium or comprises a compound semiconductor selected from the group consisting of: InP, GaN, and InGaP, if the semiconductor substrate is a III-V compound.

* * * * *